(12) United States Patent
Wong

(10) Patent No.: US 10,755,773 B2
(45) Date of Patent: Aug. 25, 2020

(54) SRAM CELL WITH DYNAMIC SPLIT GROUND AND SPLIT WORDLINE

(71) Applicant: INTERNATIONAL BUSINESS MACHINES CORPORATION, Armonk, NY (US)

(72) Inventor: Robert C. Wong, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/665,807

(22) Filed: Oct. 28, 2019

(65) Prior Publication Data

US 2020/0066334 A1 Feb. 27, 2020

Related U.S. Application Data

(63) Continuation of application No. 15/798,953, filed on Oct. 31, 2017, which is a continuation of application
(Continued)

(51) Int. Cl.
*G11C 11/00* (2006.01)
*G11C 11/419* (2006.01)
(Continued)

(52) U.S. Cl.
CPC .......... *G11C 11/419* (2013.01); *G11C 11/418* (2013.01); *G11C 8/14* (2013.01)

(58) Field of Classification Search
CPC ....... G11C 11/419; G11C 7/22; G11C 11/412; G11C 7/12; G11C 7/222; G11C 11/4096;
(Continued)

(56) References Cited

U.S. PATENT DOCUMENTS 5,740,113 A 4/1998 Kaneko
5,973,985 A 10/1999 Ferrant
(Continued)

FOREIGN PATENT DOCUMENTS

KR 1020010048139 6/2001

OTHER PUBLICATIONS

"List of IBM Patents or Patent Applications Treated as Related", dated Oct. 25, 2019, 1 page.
(Continued)

*Primary Examiner* — Thong Q Le
(74) *Attorney, Agent, or Firm* — Steven Meyers; Andrew M. Calderon; Roberts Calderon Safran & Cole, P.C.

(57) ABSTRACT

An SRAM cell with dynamic split ground (GND) and split wordline (WL) for extreme scaling is disclosed. The memory cell includes a first access transistor enabled by a first wordline to control access to cross coupled inverters by a first bitline. The memory cell further includes a second access transistor enabled by a second wordline to control access to the cross coupled inverters by a second bitline. The memory cell further includes a split ground line comprising a first ground line (GNDL) separated from a second ground line (GNDR). The GNDL is connected to a transistor of a first inverter of the cross coupled inverters and the GNDR is connected to a first transistor of a second inverter of the cross coupled inverters.

11 Claims, 3 Drawing Sheets

Related U.S. Application Data

No. 15/287,263, filed on Oct. 6, 2016, now Pat. No. 9,881,668, which is a continuation of application No. 14/963,586, filed on Dec. 9, 2015, now Pat. No. 9,576,646, which is a continuation of application No. 14/558,238, filed on Dec. 2, 2014, now Pat. No. 9,293,192.

(51) Int. Cl.
  *G11C 11/418* (2006.01)
  *G11C 8/14* (2006.01)

(58) Field of Classification Search
  CPC . G11C 29/52; G11C 11/4076; G11C 11/4093; G11C 7/06; G11C 7/1006
  USPC .............. 365/189.11, 190, 203, 177, 189.08, 365/189.16, 194, 205, 207, 154, 156, 188, 365/189.05, 189.06, 189.09
  See application file for complete search history.

(56) References Cited

U.S. PATENT DOCUMENTS

| | | |
|---|---|---|
| 5,986,923 A | 11/1999 | Zhang et al. |
| 5,986,924 A | 11/1999 | Yamada |
| 6,041,008 A | 3/2000 | Marr |
| 6,044,033 A | 3/2000 | Jang |
| 6,088,277 A | 7/2000 | Kim et al. |
| 6,198,656 B1 | 3/2001 | Zhang |
| 6,205,049 B1 | 3/2001 | Lien et al. |
| 6,215,713 B1 | 4/2001 | Austin |
| 6,385,081 B1 | 5/2002 | Shiomi |
| 7,362,606 B2 | 4/2008 | Chuang et al. |
| 7,888,201 B2 | 2/2011 | Yeo et al. |
| 7,952,912 B2 | 5/2011 | Kulkarni et al. |
| 8,432,764 B2 | 4/2013 | Heymann et al. |
| 8,630,132 B2 | 1/2014 | Cheng et al. |
| 9,293,192 B1 | 3/2016 | Wong |
| 9,576,646 B2 * | 2/2017 | Wong .................... G11C 11/418 |
| 9,881,668 B2 | 1/2018 | Wong |
| 9,934,843 B2 | 4/2018 | Wong |
| 10,347,327 B2 | 7/2019 | Wong |
| 10,366,746 B2 | 7/2019 | Wong |
| 2009/0303775 A1 | 12/2009 | Kulkarni et al. |
| 2011/0069570 A1 | 3/2011 | Katoch |
| 2014/0016402 A1 | 1/2014 | Burnett et al. |
| 2016/0155493 A1 | 6/2016 | Wong |
| 2017/0025168 A1 | 1/2017 | Wong |
| 2017/0025169 A1 | 1/2017 | Wong |
| 2018/0068718 A1 | 3/2018 | Wong |
| 2019/0272869 A1 | 9/2019 | Wong |
| 2019/0304537 A1 | 10/2019 | Wong |

OTHER PUBLICATIONS

Office Action dated Nov. 4, 2019 in related U.S. Appl. No. 15/798,953, 8 pages.
Notice of Allowance dated Dec. 13, 2019 in related U.S. Appl. No. 16/444,230, 5 pages.
Office Action dated Mar. 23, 2020 in related U.S. Appl. No. 16/418,297, 12 pages.
Notice of Allowance dated Feb. 12, 2020 in related U.S. Appl. No. 15/798,953, 5 pages.

* cited by examiner

|  | stabilityAssist | | writeAssist | | Enhanced Iread/Istby | | |
| --- | --- | --- | --- | --- | --- | --- | --- |
|  | GNDL | GNDR | GNDL | GNDR | GNDL | GNDR | WL/WR |
| standby | 0 | 0 | 0 | 0 | GNDH | GNDH | 0/0 |
| readBL | 0 | GNDH | 0 | GNDH | 0 | GNDH | Vdd/0 |
| readBR | GNDH | 0 | GNDH | 0 | GNDH | 0 | 0/Vdd |
| write0 | 0 | 0 | GNDH | 0 | GNDH | 0 | Vdd/Vdd |
| write1 | 0 | 0 | 0 | GNDH | 0 | GNDH |  |

FIG. 3

| GNDSshift assist | B136_PW128_L25 native Vt | | B108_PW072_L27 Vta -20 -70 -30 | |
| --- | --- | --- | --- | --- |
| % Vdd | 0.6 V | 0.7 V | 0.6 V | 0.7 V |
| GND shift pulse width 233ps (wc access PW) | | | | |
| 0 | 9.02 | 11.26 | 8.70 | 10.70 |
| 10% | 8.26 | 9.46 | 7.40 | 8.64 |
| 15% | 7.55 | 8.22 | 6.52 | 7.46 |
| 20% | 6.77 | 6.91 | 5.62 | 6.23 |
| GND shift pulse width 233ps X 4 | | | | |
| 0 | 9.02 | 11.26 | 8.70 | 10.70 |
| 10% | 7.37 | 8.96 | 7.03 | 8.51 |
| 15% | 6.40 | 7.71 | 6.09 | 7.32 |
| 20% | 5.37 | 6.38 | 5.08 | 6.06 |
| GND shift DC | | | | |
| 0 | 9.00 | 11.24 | 8.70 | 10.68 |
| 10% | 7.24 | 8.91 | 6.99 | 8.49 |
| 15% | 6.25 | 7.65 | 6.05 | 7.29 |
| 20% | 5.19 | 6.32 | 5.03 | 6.02 |

FIG. 4

SRAM CELL WITH DYNAMIC SPLIT GROUND AND SPLIT WORDLINE

FIELD OF THE INVENTION

The invention relates to semiconductor structures and, more particularly, to an SRAM cell with dynamic split ground (GND) and split wordline (WL) for extreme scaling.

BACKGROUND

Due to the increased portion of Static Random Access Memory (SRAM) arrays in the total chip area of modern chips, device dimensions in SRAM must be continuously scaled. However, SRAM stability degrades rapidly with scaled devices. Various methods have been employed to maintain stability but generally at the cost of performance, density and design assist overhead. For example, one approach is to use asymmetric SRAM cells to improve stability with one-sided sensing. In this approach, the wordline is split into a wordline left (WL) and a wordline right (WR). The SRAM can be read on one side only with either the WR or the WL. In this way, during read operation only the word line of the sensing side is activated.

Although stability can be enhanced with asymmetric designs, the SRAM cell is not useful for differential sensing. That is, the SRAM cell is not useful for SRAM designs with standard differential sensing from a bitline left (B L) and a bitline right (BR). Asymmetric designs also impose undesirable constraints on the SRAM applications. For example, the bit line on one side cannot be used as a 2nd read port. This effectively slows down the read/write operations. Also, the SRAM cell cannot serves as standard cell type where the asymmetric stability is not needed. Power down scheme in low power applications gets more complicated or compromised.

SUMMARY

In an aspect of the invention, a memory cell comprises a first access transistor enabled by a first wordline to control access to cross coupled inverters by a first bitline. The memory cell further comprises a second access transistor enabled by a second wordline to control access to the cross coupled inverters by a second bitline. The memory cell further comprises a split ground line comprising a first ground line (GNDL) separated from a second ground line (GNDR). The GNDL is connected to a transistor of a first inverter of the cross coupled inverters and the GNDR is connected to a first transistor of a second inverter of the cross coupled inverters.

In an aspect of the invention, a memory cell comprises: cross coupled inverters comprising PFETs and NFETs; a bitline left (BL) which accesses a first inverter of cross coupled inverters by enabling a first access transistor; a bitline right (BR) which accesses a second inverter of the cross coupled inverters by enabling a second access transistor; a wordline left (WL) with enables the first access transistor; a wordline right (WR) which enables the second access transistor; and a split vertical ground line comprising a first vertical ground line (GNDL) separated from a second vertical ground line (GNDR), the GNDL is connected to the first inverter of the cross coupled inverters and the GNDR is connected to the second inverter of the cross coupled inverters.

In an aspect of the invention, read operation of a memory cell comprises enabling a first transistor of an asymmetric memory cell to allow access of a first bitline to a storage cell, while raising or lowering a vertical ground line of two separated ground lines connected to transistors of the storage cell above or below ground, GND.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 3 shows a table of extended exploitation of split GND for SRAM scaling; and FIG. 4 shows the impact of the SRAM cell design of the present invention to data retention margins (DRM).

DETAILED DESCRIPTION

The invention relates to semiconductor structures and, more particularly, to an SRAM cell with dynamic split ground (GND) and split wordline (WL) for extreme scaling. In embodiments, the SRAM cell design includes separate vertical SRAM GND buses, e.g., GND left (GNDL) and GND right (GNDR). Advantageously, the SRAM cell of the present invention thus provides increased stability gain for asymmetric devices, while also allowing for differential sensing.

In operation, GNDL and GNDR can be dynamically shifted to enhance stability of the asymmetric device, depending on the read side of the cell. For example, GNDL can be shifted upwards, e.g., increase voltage above GND, while the sensing is on bitline right (BR); whereas, GNDR can be shifted upwards, e.g., increase voltage above GND, while sensing is on the bitline left (BL). Also, advantageously, both BL and BR can serve for 1-sided sensing, besides serving for more effective write operation. Moreover, for less demanding SRAM arrays where stability assist is not needed, setting GNDL=GNDR=0 allows standard SRAM operations such as differential sensing and global power down. Extended enhancement on writability and power/performance also becomes available with different GND shift patterns, implemented with the SRAM cell design of the present invention. Thus, in SRAM with fast NFET for quick access or with high bit line loading for array layout efficiency stability is enhanced with dynamic split GND.

The SRAM cells of the present invention can be manufactured in a number of ways using a number of different tools. In general, though, the methodologies and tools are used to form structures with dimensions in the micrometer and nanometer scale. The methodologies, i.e., technologies, employed to manufacture the SRAM cells of the present invention have been adopted from integrated circuit (IC) technology. For example, the structures of the present invention are built on wafers and are realized in films of material patterned by photolithographic processes on the top of a wafer. In particular, the fabrication of the SRAM cells of the present invention uses three basic building blocks: (i) deposition of thin films of material on a substrate, (ii) applying a patterned mask on top of the films by photolithographic imaging, and (iii) etching the films selectively to the mask.

Figure 1:
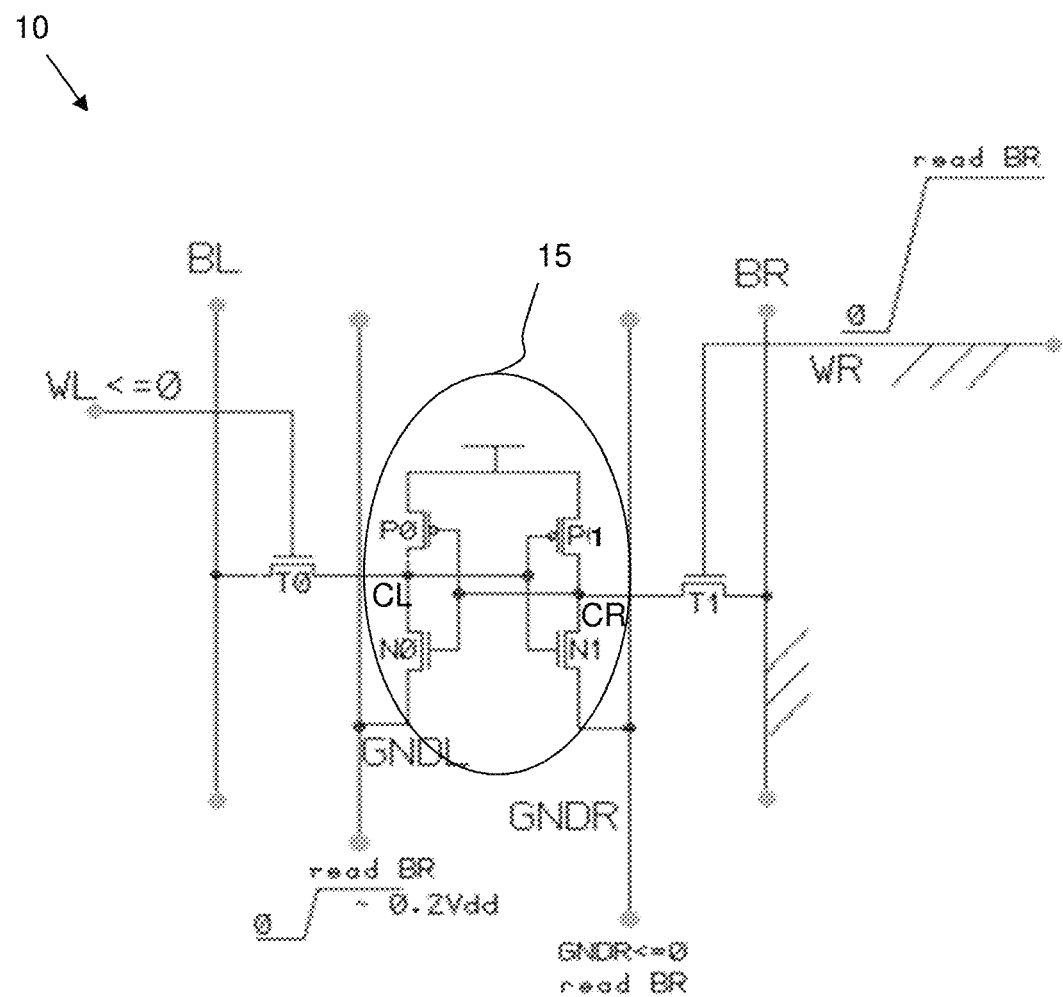
FIG. 1 shows an SRAM cell in accordance with aspects of the present invention.

FIG. 1 shows an asymmetric SRAM cell in accordance with aspects of the present invention. In embodiments, the asymmetric SRAM cell 10 includes a bitline right BR and bitline left BL, in addition to a wordline right WR and a wordline left WL. The asymmetric SRAM 10 further includes two cross-coupled inverters 15, comprising four transistors P0, P1, N0 and N1; although more transistors per bit for multi-port applications are also contemplated by the present invention. In this example embodiment, the transistors P0, P1 are PFETs and the transistors N0, N1 are NFETs.

The asymmetric SRAM 10 further includes access transistors T0 and T1. The access transistors T0 and T1 serve to control the access to the storage cell, e.g., cross-coupled inverters 15, during read and write operations. For example, access to the storage cell 15 is enabled by the word lines WL and/or WR, which controls the respective access transistors T0 and T1 which, in turn, control whether the storage cell 15 should be connected to (e.g., accessed by) the respective bit lines BL and BR. Thus, as should be understood by those of skill in the art, the access transistors T0 and T1 are used to transfer data for both read and write operations.

CL is the node across T0 from BL and CR is the node across T1 from BR. During global reset of memory array to zero state, the GNDL is raised to Vdd to pull down CR and push up CL. During global set of memory array to one state, the GNDR is raised to Vdd to pull down the CL and push up the CR. During global set/reset of specific columns of memory array to specific zero state and one state, the GNDL of specific columns are raised to Vdd, and the GNDR of other specific columns are raised to Vdd.

The asymmetric SRAM 10 further includes a vertical split ground line, e.g., GNDL and GNDR. In embodiments, the ground line GNDL is connected directly to transistor N0 on the left side of the asymmetric SRAM 10; that is, the ground line GNDL is isolated from transistor N1 on the right side of the asymmetric SRAM 10. In contrast, the ground line GNDR is connected directly to transistor N1 on the right side of the asymmetric SRAM 10; that is, the ground line GNDR is isolated from transistor N0 on the left side of the asymmetric SRAM 10. Thus, the vertical GND lines (GNDR and GNDL) are kept separate; instead of being strapped together as in conventional SRAM cells.

In embodiments, the SRAM cell 10 has three different operating modes or states: standby mode, reading mode and writing mode. In standby mode, the SRAM cell 10 is idle; whereas, in reading mode, the data are read out and in writing mode, the contents of the cell are updated. By implementing the designs of the present invention, e.g., vertical split ground lines GNDL and GNDR, the SRAM cell 10 of the present invention provides the necessary "stability" and "write-ability" which had been diminishing in conventional SRAM cells of scaled down dimensions.

In operation during read access for bitline BL, the wordline WL is raised to bring down the bitline BL for sensing. In one embodiment, the GNDL is lowered by about 10% of Vdd below common ground, GND. In further embodiment, GNDR can be simultaneously raised above common ground GND by about 10% of Vdd to minimize read disturb.

Similarly, in operation during read access for bitline BR, the wordline WR is raised to bring down the bitline BR. Also, GNDR is lowered below common GND to help sensing. In further embodiment, the GNDL can be simultaneously raised by about 10% of Vdd above common GND to minimize read disturb.

In SRAM cells with less demand on stability, GNDL and GNDR are kept common, e.g., GNDL=GNDR=0, as in conventional designs with standard differential sensing and bit column control circuitry. Accordingly, in this way the asymmetric design of the SRAM cell 10 allows for differential signaling, which makes small voltage swings more easily detectable. Also, in embodiments, two (2) read port operations with GND shift assist are still available if the same row of cells is not accessed in the same cycle or if the access assist for reading or writing of one side does not ruin or degrade the access of the other side.

Figure 2:
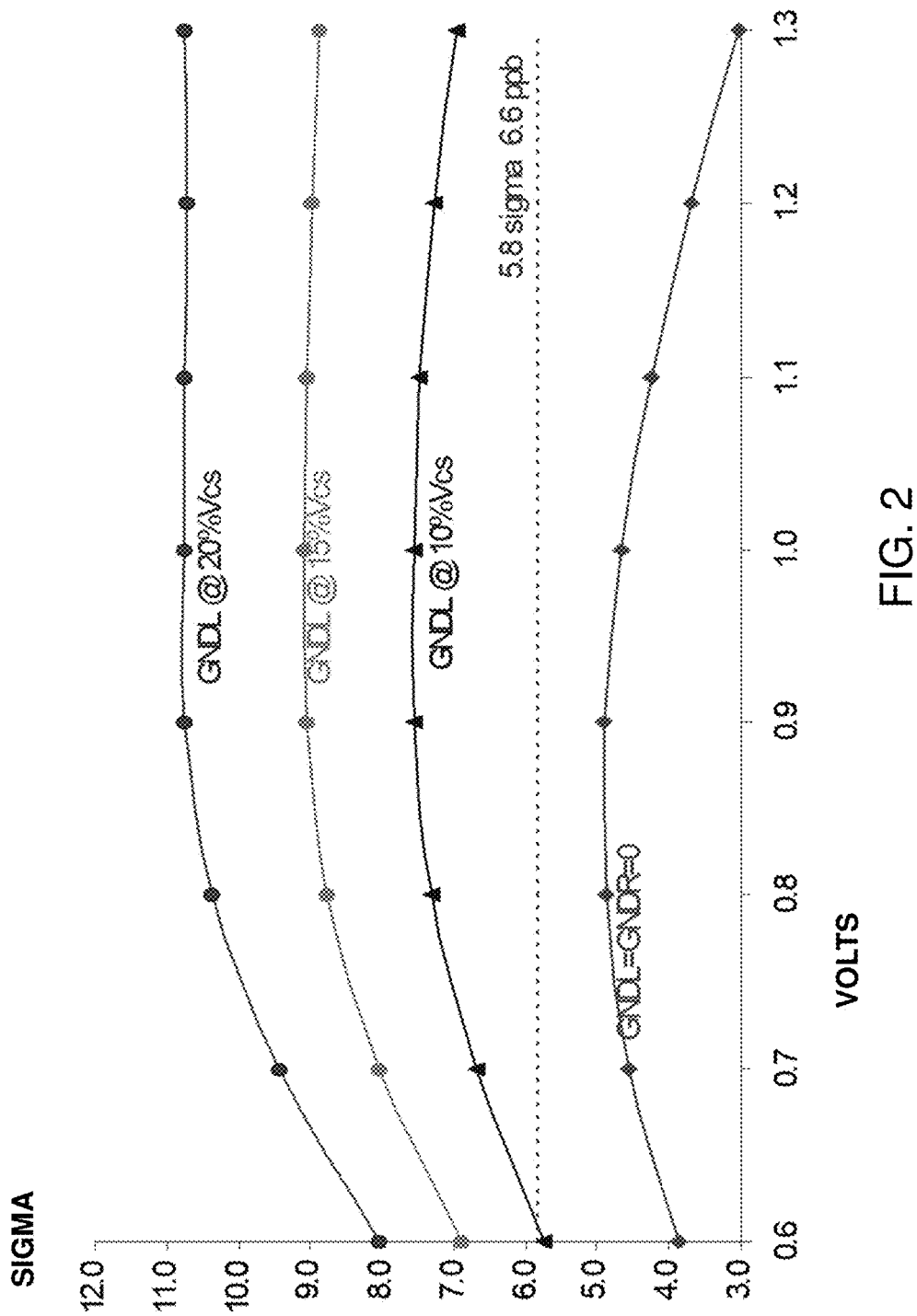
FIG. 2 shows a performance graph comparing the SRAM cell designs of the present invention to a conventional asymmetric SRAM.

In split GND schemes as contemplated by the present invention, further improvement of margins, performance, and power are accomplished with different combinations of GNDL/GNDR shifts. For example, FIG. 2 shows a graph of stability of the SRAM cell designs with a shift of GNDL. In this graph, the y-axis represents sigma (of Access Disturb Margin (ADM)) and the x-axis is supply voltage. As shown in this graph, when GNDL=GNDR=0, the sigma is about 4.0, which is below the required stability at 6.0 σ (sigma) for a possible failure rate around 1 part per billion. However, when GNDL is about 10% of Vdd (Vcs) above GND, the stability of the cell increases to above 6 σ for low Vdd application around 0.61V. Accordingly, even a GND shift of approximately 10% Vdd will improve Access Disturb Margin (ADM) by approximately 2.0 σ. The scaled down SRAM cells to be discarded for poor operation margins can thus be revived with robust operation margins by the split GND arrangement. ADM further increases when GNDL is raised with 15%-20% of Vdd above common ground GND before hitting the lower bound of the transient DRM (data retention margin) of all cells along the selected columns. With a split GND assist design (e.g., GNDL, GNDR), ADM degradation from extreme scaling no longer constraints SRAM applications when split GNDL or GNDR voltage can be independently adjusted around the common ground GND.

FIG. 3 shows a table of extended exploitation of split GND for SRAM scaling. As shown in FIG. 3, the split GND design of the present invention provides very efficient write assist when the cell GNDL or GNDR is elevated above the bit line down level 0 (referred as elevated GND assist). There is further power saving when the standby cell Vdd is at an elevated GND (e.g., GNDH). In this representation, GNDH is elevated to about 10-15% of Vdd above GND. Also, as shown in the table of FIG. 3, stability assist and write assist are provided with small voltage shift of GNDL or GNDR relative to common GND. Write( ) refers to pulling down CR and pushing up CL, where CR is the cell node on the right side and CL is the cell node on the left side. Write operation is assumed to be done with complementary input on BL and BR from activation of both WL and WR. Single port write is also made feasible with complementary GND shift of GNDL and GNDR in this split GND construct. Column GND shift assist would be more convenient if it can be applied to whole row of cells for simpler circuitry of column select.

FIG. 4 shows a table of the impact of the split GND design of the present invention on DRM (Data Retention Margin). As shown in FIG. 4, there is negligible impact of DRM on a cell within the same column when GNDR GNDL when the operation voltage is around 0.6 V or higher.

The method(s) as described above is used in the fabrication of integrated circuit chips with SRAM cells. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory cell, comprising:
    a first ground line (GNDL) separated from a second ground line (GNDR), the GNDL being connected to a first inverter and the GNDR being connected to a second inverter,
    wherein during read access on a first bitline, the GNDL is raised by a predetermined amount of Vdd above a common ground GND and the GNDR is lowered by a predetermined amount of Vdd below the common ground GND,
    the first inverter comprises a first PFET with its source connected to a power supply, and
    the second inverter comprises a second PFET with its source connected to the power supply.

2. The memory cell of claim 1, wherein the predetermined amount of Vdd above the common ground GND is about 10% of Vdd.

3. The memory cell of claim 1, wherein the predetermined amount of Vdd below the common ground GND is about 10% of Vdd.

4. The memory cell of claim 1, further comprising:
    a first access transistor that controls access to the first inverter and the second inverter by the first bitline; and
    a second access transistor that controls access to the first inverter and the second inverter by a second bitline.

5. The memory cell of claim 1, wherein GNDL and GNDR are kept common.

6. The memory cell of claim 1, wherein the GNDR and the GNDL are not strapped together.

7. The memory cell of claim 1, wherein the GNDR and GNDL allow for differential signaling.

8. The memory cell of claim 1, wherein each of the first inverter and the second inverter comprises two transistors.

9. The memory cell of claim 1, wherein each of the first inverter and the second inverter comprises more than two transistors.

10. The memory cell of claim 1, wherein:
    a transistor of the first inverter and a transistor of the second inverter are NFETs;
    the GNDL is connected directly to the NFET of the first inverter; and
    the GNDR is connected directly to the NFET of the second inverter.

11. The memory cell of claim 1, wherein the GNDL and GNDR are separate vertical ground lines.

* * * * *